United States Patent [19]
Takahashi et al.

[11] Patent Number: 5,804,917
[45] Date of Patent: Sep. 8, 1998

[54] ORGANIC ELECTROLUMINESCENT DISPLAY DEVICE AND METHOD FOR MANUFACTURING SAME

[75] Inventors: Hisamitsu Takahashi; Yoshihisa Tsuruoka; Toshio Miyauchi; Shigeru Hieda, all of Mobara, Japan

[73] Assignee: Futaba Denshi Kogyo K.K., Mobara, Japan

[21] Appl. No.: 593,972

[22] Filed: Jan. 30, 1996

[51] Int. Cl.⁶ ................................................... H05B 33/02
[52] U.S. Cl. ........................ 313/504; 313/503; 313/505; 313/500
[58] Field of Search ................................. 313/500, 503, 313/504, 505, 512, 509; 315/169.1, 169.3

[56] References Cited

U.S. PATENT DOCUMENTS

| | | | |
|---|---|---|---|
| 4,015,166 | 3/1977 | Ohshima et al. ................. | 313/503 |
| 4,692,662 | 9/1987 | Wada et al. ...................... | 313/587 |
| 4,803,402 | 2/1989 | Raber et al. ...................... | 313/587 |
| 4,843,281 | 6/1989 | Mendelsohn ..................... | 313/587 |
| 5,053,679 | 10/1991 | Thioulouse ....................... | 313/512 |
| 5,276,380 | 1/1994 | Tang ................................. | 313/505 |
| 5,302,468 | 4/1994 | Namiki et al. ................... | 313/504 |
| 5,634,836 | 6/1997 | Lepselter ......................... | 313/587 |

*Primary Examiner*—Sandra L. O'Shea
*Assistant Examiner*—Joseph Williams
*Attorney, Agent, or Firm*—Oblon, Spivak, McClelland, Maier & Neustadt, P.C.

[57] ABSTRACT

An organic electroluminescent display device capable of permitting upper electrodes of a fine pattern to be formed and exhibiting increased durability. Ribs are spaced at predetermined intervals on transparent electrodes arranged in the form of a film on a lower transparent substrate. An organic layer is formed between each adjacent two of the ribs and an upper electrode is deposited all over the transparent electrodes. A portion of the upper electrode formed on each of the ribs is removed by scraping, rubbing or the like, resulting in the upper electrode being formed on only each of the organic layers. A cap layer may be provided on the upper electrode as required.

7 Claims, 7 Drawing Sheets

FIG.3(c) CALCINATION

FIG.3(d) WASHING·DRYING

FIG.3(e) FORMATION OF ORGANIC LAYER AS FILM

FIG.4(c) EXPOSURE

FIG.4(d) DEVELOPMENT

FIG.4(e) CALCINATION

FIG.4(f) WASHING· DRYING

FIG.4(g) FORMATION OF EL FILM

PATTERNING

SEALING

ORGANIC ELECTROLUMINESCENT DISPLAY DEVICE AND METHOD FOR MANUFACTURING SAME

BACKGROUND OF THE INVENTION

This invention relates to an organic electroluminescent display device, and more particularly to an organic electroluminescent display device including an organic electroluminescent medium and a method for manufacturing the same.

Figure 8:
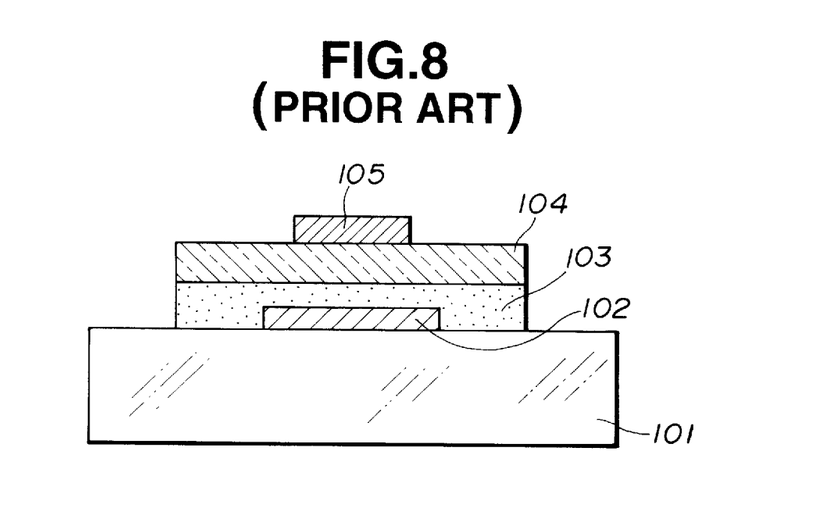
FIG. 8 is a schematic sectional view showing a conventional organic electroluminescent luminous element.

A conventional organic electroluminescent (hereinafter also referred to as "EL") luminous element is generally constructed as shown in FIG. 8.

More particularly, the conventional organic EL luminous element includes a transparent film-like ITO electrode 102 formed on a glass substrate 101, a hole transport layer 103 arranged on the ITO electrode 102 so as to cover it, a film-like luminous layer 104 formed on the hole transport layer 103, and an upper electrode 105 formed on the luminous layer 104.

In the conventional EL luminous element thus constructed, when a negative DC voltage and a positive DC voltage are applied to the upper electrode 105 and ITO electrode 102, respectively, holes injected from the ITO electrode 2 are injected into the luminous layer 104 while being transported through the hole transport layer 103. Whereas, electrons are injected from the upper electrode 105 into the luminous layer 104, so that the electrons thus injected and the holes injected from the hole transport layer 103 are recombined with each other in the luminous layer 104.

Such recombination leads to luminescence of the luminous layer 104, which may be observed through the light-permeable hole transport layer 103, ITO electrode 102 and glass substrate 101.

Such luminescence is carried out at a level of 1000 cd/cm$^2$ or more when the DC voltage is 10 volts or less.

The hole transport layer 103 is generally made of triphenyl diamine (TPD) and the luminous layer 104 is generally made of an aluminum-quinolinol complex (Alq$_3$).

Also, the organic EL medium constituted by the hole transport layer 103 and luminous layer 104 is replaced with a single phase structure made of a luminous polymer.

An organic electroluminescent display device utilizing a luminous principle of the EL luminous element thus formed is constructed in such a manner that a plurality of ITO electrodes each acting as a lower electrode are formed in a stripe-like manner and a plurality of upper electrodes are arranged in a stripe-like manner and so as to extend in a direction perpendicular to the stripe-like ITO electrodes, resulting in forming a matrix by cooperation between the ITO electrodes and upper electrodes. Then, the matrix is scanned by a drive means, so that luminescence of picture cells defined at intersections on the matrix is controlled in order by an image signal, leading to display of an image.

In such image display, resolution is determined depending on a width of each of the ITO electrodes and upper electrodes arranged in a stripe-like manner. The width is desirably as small as ten microns or less in view of resolution required.

In general, the ITO electrodes and upper electrodes each are formed by mask deposition. Unfortunately, the mask deposition fails to form a fine pattern as small as 0.1 mm or less. Wet chemical patterning techniques permit formation of fine or precise patterns. However, wet etching causes an organic EL medium to be contacted with an etching liquid or the like, to thereby be deteriorated in characteristics, so that quality of image display and durability thereof is deteriorated.

An organic electroluminescent display device which is intended to solve such a problem as described above is proposed in Japanese Patent Application Laid-Open Publication No. 275172/1993. The organic electroluminescent display device proposed is constructed, for example, in such a manner as shown in FIG. 9.

Figure 9:
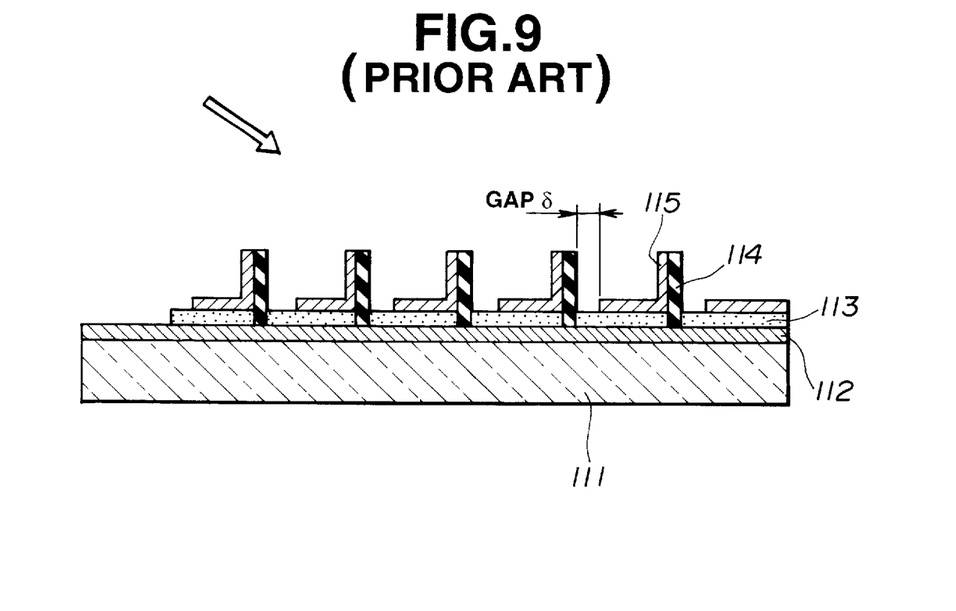
FIG. 9 is a schematic sectional view showing a conventional organic electroluminescent display device.

The organic electroluminescent display device shown in FIG. 9 includes ITO electrodes 112 formed in a stripe-like manner on a glass substrate 111, ribs 114 arranged on the ITO electrodes 112 so as to be spaced from each other at intervals in a wall-like manner and extend in a direction perpendicular to the ITO electrodes 112, and organic layers 113 each arranged between each adjacent two of the ribs 114 and made of an organic EL medium, which cooperate with each other to form an assembly. The ribs 114 each are formed into a height substantially higher than a thickness of the organic layer 113.

Then, a conductive film for upper electrodes 115 is deposited on a whole surface of the thus-formed assembly in such an oblique downward direction as indicated by an arrow in FIG. 9. However, this fails to permit the conductive film to be deposited on a portion of the assembly shaded by each of the ribs 114, so that the upper electrodes 115, as shown in FIG. 8, each are formed in a manner to be electrically independent for every organic layer 113.

The upper electrodes 115 are formed in a stripe-like manner and arranged so as to be perpendicular to the ITO electrode 112, so that the ITO electrodes 112 and upper electrodes 115 cooperate with each other to define a matrix.

Also, the upper electrodes 115 can be formed in a fine pattern, to thereby permit the conventional organic electroluminescent display device to exhibit desired resolution.

However, the conventional organic electroluminescent display device constructed as shown in FIG. 9 causes a gap to be necessarily formed between each of the ribs 114 and each of the upper electrodes 115 during manufacturing thereof. This results in the organic layer 113 being exposed at the gap δ, so that oxygen, moisture and the like enter an interface between the upper electrode 115 and the organic layer 113 and an interface between the organic layer 113 and the ITO electrode 112 through the exposed portion of the upper electrode 115, leading to deterioration of durability of the organic electroluminescent display device.

In order to avoid the problem, it would be considered to arrange a cap layer all over the upper electrode 115 to prevent the organic layer 113 from being exposed. It is known in the art that use of a metal material such as aluminum, indium or the like for the cap layer permits the cap layer to exhibit satisfactory characteristics. However, formation of a metal material into the cap layer causes short-circuiting between the upper layers 115. Thus, in the prior art, the cap layer is forced to be made of an insulating material such as silica or the like which is deteriorated in characteristics as compared with a metal material.

SUMMARY OF THE INVENTION

The present invention has been made in view of the foregoing disadvantage of the prior art.

Accordingly, it is an object of the present invention to provide an organic electroluminescent display device which is capable of forming upper electrodes in a fine pattern.

It is another object of the present invention to provide an organic electroluminescent display device which is capable of exhibiting improved durability.

It is a further object of the present invention to provide a method for manufacturing an organic electroluminescent display device which is capable of providing an organic electroluminescent display device exhibiting the above-described objects.

In accordance with one aspect of the present invention, an organic electroluminescent display device is provided. The organic electroluminescent display device includes a light-permeable substrate, a plurality of transparent electrodes arranged in a stripe-like manner on the light-permeable substrate and formed of a light-permeable conductive film, a plurality of ribs made of an insulating material and arranged in a stripe-like manner on the transparent electrodes so as to extend in a direction perpendicular to the transparent electrodes, organic layers each formed of an organic electroluminescent medium and arranged between each adjacent two of the ribs, and upper electrodes each made of a conductive film deposited all over each of the organic layers and formed into a thickness not exceeding a thickness of each of the ribs.

In a preferred embodiment of the present invention, the organic electroluminescent display device includes a seal member arranged in a frame-like manner on an outer periphery of the light-permeable substrate and formed into a thickness substantially identical with that of the rib and an upper substrate fixedly arranged on the seal member.

In accordance with another aspect of the present invention, a method for manufacturing an organic electroluminescent display device is provided. The method comprises the step of arranging a plurality of transparent electrodes in a stripe-like manner on a light-permeable substrate. The transparent electrodes are made of a light-permeable conductive film. The method also comprises the steps of forming a plurality of insulating ribs in a stripe-like manner on the transparent electrodes so as to extend in a direction perpendicular to the transparent electrodes and arranging an organic layers in the form of a film between each adjacent two of the ribs. The organic layers each are made of an organic electroluminescent medium. The method further comprises the step of forming a conductive film all over each of the organic layers by deposition so as to have a thickness not exceeding a thickness of the ribs. A portion of the conductive film deposited on each of the ribs is mechanically removed, resulting in an upper electrode being formed on each of the organic layers.

In accordance with this aspect of the present invention, a method for manufacturing an organic electroluminescent display device is provided. The method comprises the step of arranging a plurality of transparent electrodes in a stripe-like manner on a light-permeable substrate. The transparent electrodes are made of a light-permeable conductive film. The method also comprises the steps of forming a plurality of insulating ribs in a stripe-like manner on the transparent electrodes so as to extend in a direction perpendicular to the transparent electrodes and arranging organic layers in the form of a film between each adjacent two of the ribs. The organic layers each are made of an organic electroluminescent medium. The method further comprises the steps of arranging, on the ribs, a mask formed with slits and depositing a conductive film on only each of the organic layers through each of the slits to form an upper electrode on each of the organic layers.

BRIEF DESCRIPTION OF THE DRAWINGS

These and other objects and many of the attendant advantages of the present invention will be readily appreciated as the same becomes better understood by reference to the following detailed description when considered in connection with the accompanying drawings, wherein:

FIGS. 4(a)–4(g) illustrate a flow chart showing a group of steps in another example of formation of ribs incorporated in an organic electroluminescent display device of the present invention;

DETAILED DESCRIPTION OF THE PREFERRED EMBODIMENT

Now, an organic electroluminescent display device according to the present invention will be described hereinafter with reference to FIGS. 1 to 7.

Figure 1:
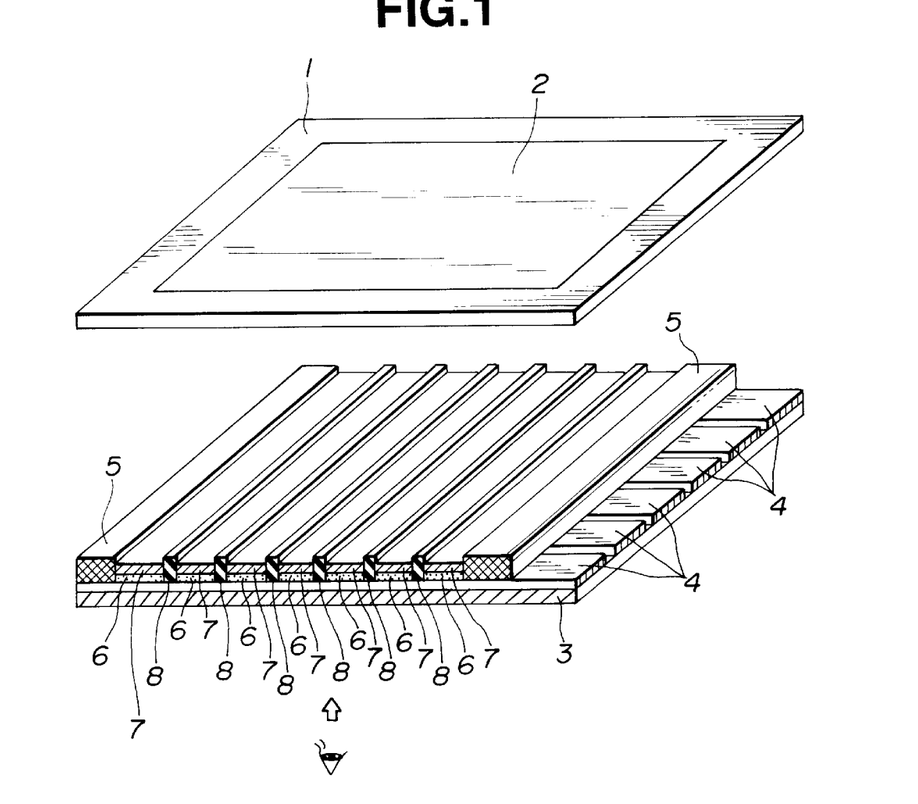
FIG. 1 is an exploded perspective view showing an embodiment of an organic electroluminescent display device according to the present invention.
Figure 2:
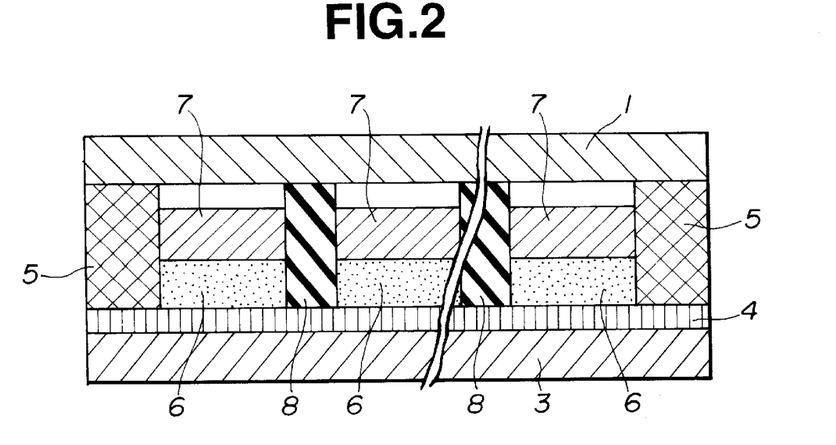
FIG. 2 is a sectional view of the organic electroluminescent display device shown in FIG. 1.

Referring first to FIGS. 1 and 2, an embodiment of an organic electroluminescent display device according to the present invention is illustrated. An organic electroluminescent (EL) display device of the illustrated embodiment includes an upper substrate 1 made of an insulating material such as glass or the like. The upper substrate 1 has a getter material application area 2 on the basis of which a getter is applied to an inner surface of the upper substrate 1. The organic EL display device also includes a lower substrate 3 made of a transparent material, which has a plurality of light-permeable transparent electrodes 4 made of ITO or the like and arranged thereon in a stripe-like manner. Reference numeral 5 designates a seal member formed into a frame-like configuration and arranged on the transparent electrodes 4 so as to extend around an outer periphery of the lower transparent substrate 3. In FIG. 1, only a part of the seal member 5 is shown for the sake of brevity. The organic electroluminescent display device further includes an organic layer 6 made of an organic electroluminescent (EL) medium and arranged between each adjacent two of a plurality of ribs 8 so as to extend in a direction perpendicular to the transparent electrodes 4. The organic layers 6 each have an upper electrode 7 formed on only a whole upper surface thereof. The upper electrodes 7 are arranged in a stripe-like manner. The ribs 8 are made of an insulating material and arranged so as to be spaced from each other at predetermined intervals and extend in a direction perpendicular to the transparent electrodes 4.

The seal member 5 and ribs 8 are formed so as to be flush with each other or into the same height or thickness. The upper substrate 1 is attached to the seal member 5 formed in a frame-like manner on the lower transparent substrate 3, so that the upper substrate 1 and lower transparent substrate 3 are sealedly joined to each other through the seal member 5, to thereby provide an envelope for the display device. The joining may be carried out adhesively or by fusion.

In the envelope thus formed, the ribs 8 each function as a spacer for supporting the upper substrate 1 and lower transparent substrate 3 while spacing both substrates from each other at a predetermined interval.

FIG. 2 shows the organic EL display device of the illustrated embodiment thus constructed, on which a getter is not yet applied to the upper substrate. As shown in FIG. 2, the transparent electrodes 4 are arranged in the form of a thin film on the light-permeable lower transparent substrate 3 and the seal member 5 is formed on the transparent electrodes 4 so as to extend along the outer periphery of the lower transparent substrate 3. Also, the lower transparent substrate 3 is provided on a portion thereof surrounded by the seal member 5 with a plurality of the ribs 8 in a wall-like and stripe-like manner. The ribs 8 may be made of a suitable material such as lead glass having a black pigment added thereto or the like and are arranged so as to be perpendicular to the transparent electrodes 4.

Between each adjacent two of the ribs 8, as well as between each of the ribs 8 and the seal member 5, the organic layer 6 acting as a light emitter and the upper electrode 7 which are in the form of a thin film are laminatedly arranged in order. The organic layers 6 and upper electrodes 7 are arranged so as to be perpendicular to the transparent electrodes 4.

Thus, the transparent electrodes 4 and upper electrodes 7 cooperate with each other to form a matrix of picture cells. The picture cells are driven in turn by a transparent electrode drive circuit (not shown) and an upper electrode drive circuit (not shown), so that the organic layers 6 of the picture cells are controlled for luminescence in order by an image signal fed from the circuits thereto.

In the illustrated embodiment, the ribs 8 are black-colored and arranged in a stripe-like manner, so that an image observed upwardly from below the lower transparent substrate 3 may be increased on contrast.

The organic layer 6 is conveniently constituted by an organic electroluminescent medium of a two-layer structure constructed of a hole transport layer made of triphenyl diamine (TPD) and a luminous layer made of an aluminum-quinolinol complex ($Alq_3$). Alternatively, it may be formed of an organic electroluminescent medium constructed of a single-layer structure made of polyparaphenylenevinylene (PPV).

The organic layers 6 each are fully covered so as not to be exposed, so that the upper electrodes 7 each are formed thereon with a cap as required. In the illustrated embodiment, when the cap layer on each of the ribs 8 is mechanically removed therefrom, the cap layer may be made of metal such as aluminum or the like.

Now, manufacturing of the organic EL display device constructed in such a manner as described above with reference to FIGS. 1 and 2 will be described hereinafter.

First, the ribs 8 are formed on the transparent electrodes 4. The formation may take place according to any one of three processes.

A first process is screen printing techniques, which will be described hereinafter with reference to FIGS. 3(a(–3(e).

Figure 3A:
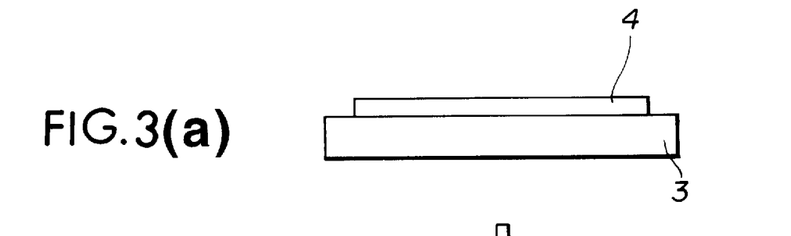
FIGS. 3(a)–3(e) illustrate a flow chart showing a group of steps in an example of formation of ribs incorporated in an organic electroluminescent display device of the present invention.
Figure 3B:
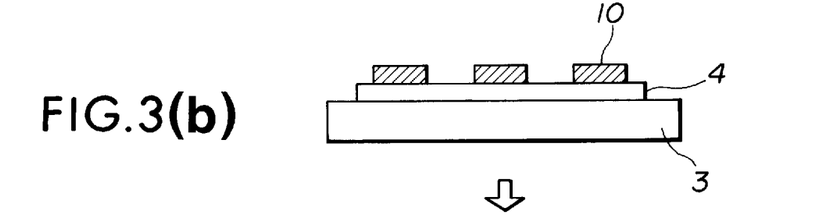

First, as indicated in FIG. 3(a), transparent electrodes 4 are arranged in the form of a film on a lower transparent substrate 3. Then, cross pastes 10 are formed in a stripe-like manner on the transparent electrodes 4 by screen printing, resulting in providing an assembly. The cross pastes 10 may be formed of a paste material obtained by mixing a black pigment with lead glass and a vehicle for printing.

Figure 3C:
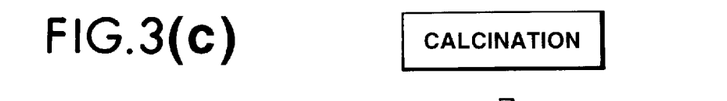
Figure 3D:
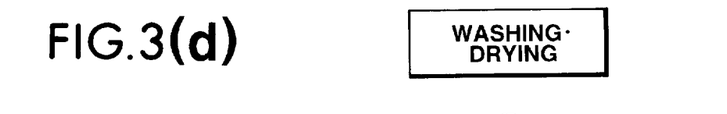
Figure 3E:
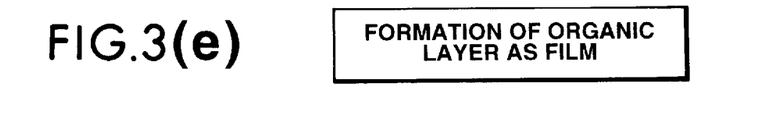
Figure 4A:
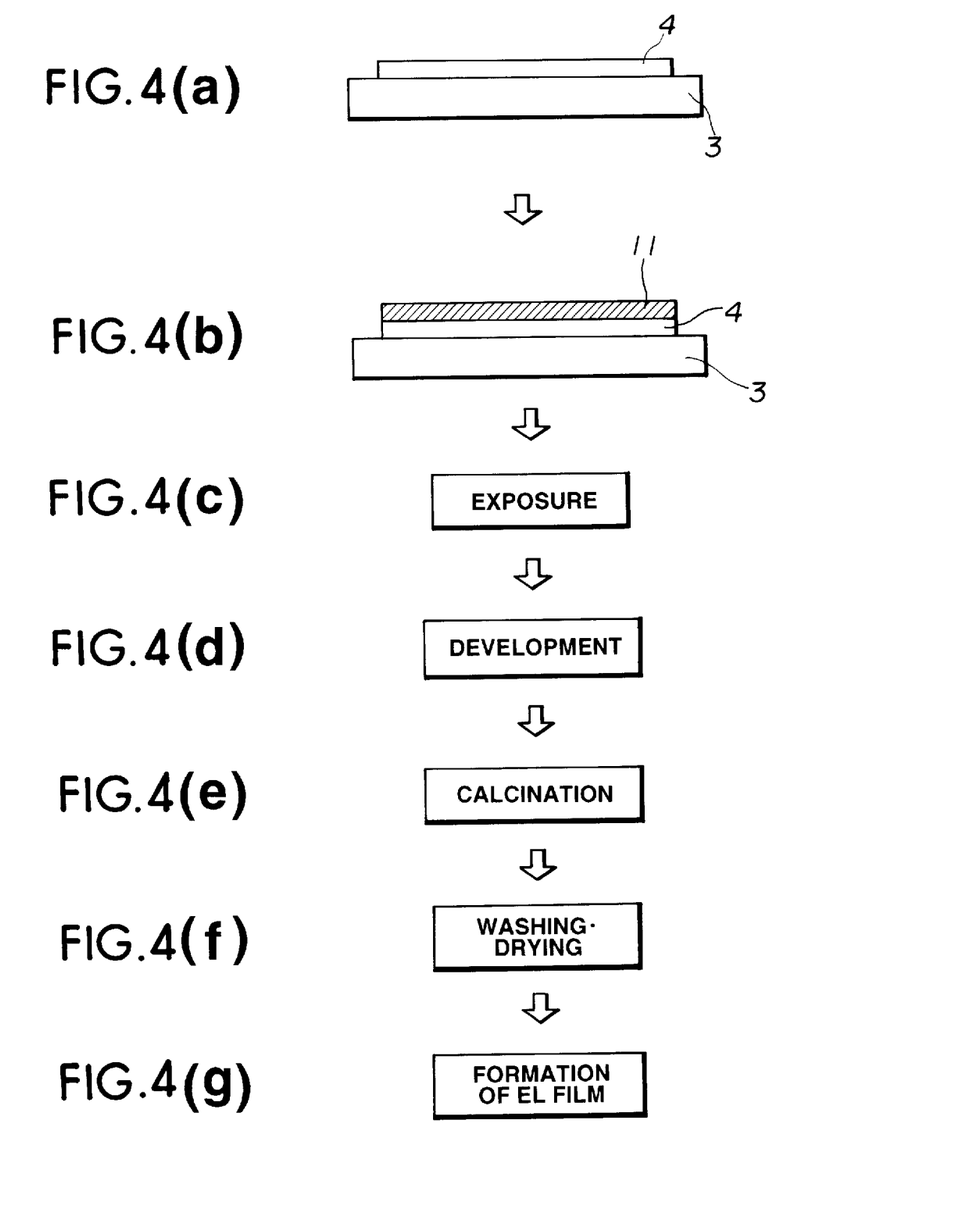

Then, the assembly thus formed is subject to calcination as indicated at in FIG. 3(c), followed by washing and drying as indicated at in FIG. 3(d), leading to formation of a plurality of stripe-like ribs 8. Thereafter, formation of the organic layers 6 in the form of a film takes places as indicated in at FIG. 3(a).

A second process utilizes a photosensitive paste material and is practiced in such a manner as shown in FIGS. 4(a)–4(g). More particularly, transparent electrodes 4 are first formed in the form of a film on a lower transparent substrate 3 as indicated at in FIG. 4(a) and then a photosensitive cross paste 11 is applied to the transparent electrodes 4 so as to extend over the whole lower transparent substrate 3, as indicated at in FIG. 4(b). Then, the photosensitive cross paste 11 is selectively subject to exposure through a mask in FIG. 4(c) and then development in FIG. 4(d), so that an exposed portion of the photosensitive cross paste 11 or an unexposed portion thereof is removed depending on properties of the photosensitive cross paste 11, resulting in the cross paste 11 being formed into a stripe-like shape. A material for the photosensitive cross paste 11 may be obtained by mixing a black pigment with lead glass and a photosensitive agent to prepare a mixture and then providing the mixture with pasty properties.

Subsequently, calcination takes place (in FIG. 4(e)), followed by washing and drying (in FIG. 4(f)), resulting in a plurality of the stripe-like ribs 8 being formed. Thereafter, formation of organic layers 6 as a film takes place (in FIG. 4(g)).

Figure 5A:
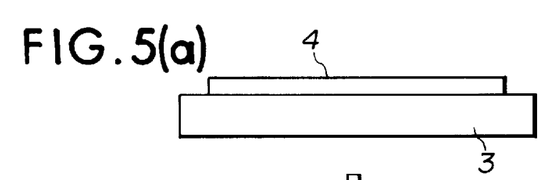
FIGS. 5(a)–5(l) illustrate a flow chart showing a group of steps in a further example of formation of ribs incorporated in an organic electroluminescent display device of the present invention.
Figures 5B, 5C:
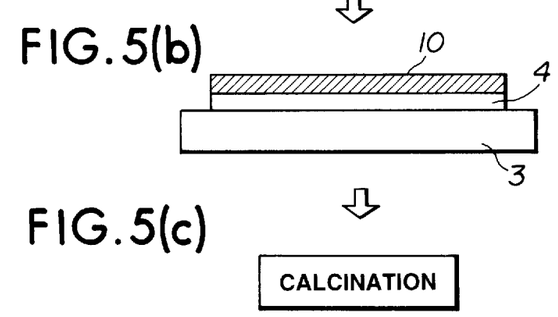
Figure 5D:
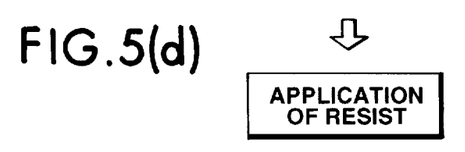
Figure 5E:
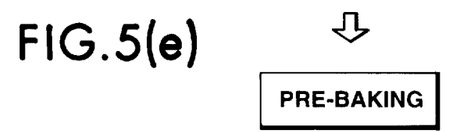
Figure 5F:
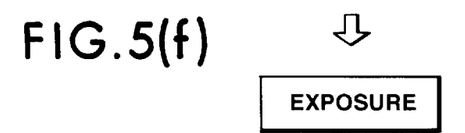
Figure 5G:
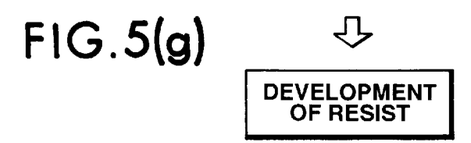

A third process is photolithography and carried out in such a manner as shown in FIGS. 5(a)–5(l). More particularly, transparent electrodes 4 are first formed in the form of a film on the a lower transparent substrate 3 as indicated in FIG. 5(a) and then such a cross paste 10 as used in the first process described above is applied to the transparent electrodes 4 so as to extend over the whole lower transparent substrate 3, as indicated in FIG. 5(b). Then, calcination (FIG. 5(c)) and application of a resist (FIG. 5(d)) are carried out in turn, followed by pre-baking (FIG. 5(e)). Thereafter, the resist is subject to development (FIG. 5g)), so that an exposed portion of the resist or an unexposed portion thereof is removed depending on properties of the resist, resulting in the resist being formed into a stripe-like shape.

Figure 5H:
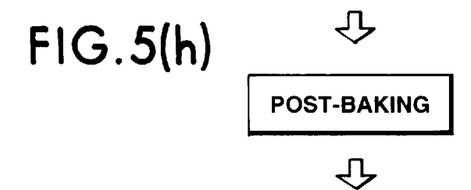
Figure 5I:
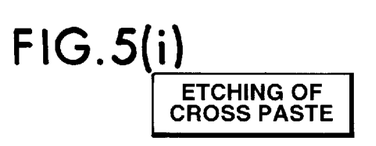
Figure 5J:
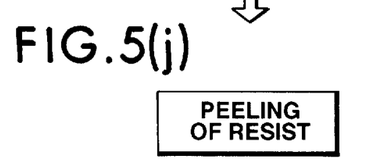
Figure 5K:
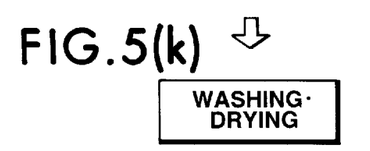
Figure 5L:
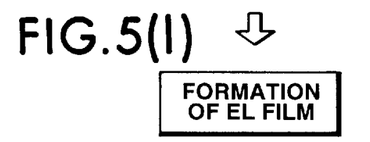

Subsequently, post-baking (FIG. 5h)) takes place and then the cross paste 10 calcined is subject to etching (FIG. 5(i)) to form the cross paste 10 into a stripe-like shape. Thereafter, the resist is peeled (FIG. 5(j)), followed by washing and drying FIG. 5(k)), so that a plurality of stripe-like ribs 8 may be formed. Then, formation of organic layers 6 in the form of a film (FIG. 5l)) is practiced.

The above-described first to third processes each permit the ribs 8 formed to have a width of 30 $\mu$m to 100 $\mu$m and an interval between the ribs 8 to be 50 $\mu$m to 300 $\mu$m.

Now, formation of the organic layers 6 in the form of a film will be described hereinafter. Two processes are applied to the formation.

One of the processes is a dry process by vacuum deposition. More particularly, triphenyl diamine (TPD) is subject to vacuum deposition to form hole transport layers in the form of a film and then an aluminum-quinolinol complex (Alq$_3$) is subject to vacuum deposition to form a luminous layer in the form of a film on each of the hole transport layers. This results in the organic layers 6 each being constructed into a two-layer structure.

The hole transport layer and luminous layer of the organic layer 6 of the two-layer structure each are formed into a thickness of 500 Å to 1000 Å. A portion of the organic layer 6 which is deposited on each of the ribs 8 is removed by any suitable mechanical means such as scraping, rubbing or the like.

The other process is a wet process, which is practiced by doctor blade techniques, dipping, spinner application, roll coating, spraying, screen printing or the like. Now, doctor blade techniques will be described hereinafter as an example.

In the doctor blade techniques, a polyparaphenylenevinylene (PPV) precursor is dissolved in a suitable solvent such as methanol, a halogen solvent or the like to prepare a solution, which is then dropped onto the transparent electrodes 4 on which the ribs 8 are formed. Then, the solution is applied thereto by means of a blade, to thereby deposit the PPV precursor on a portion of the transparent electrodes 4 between the ribs 8. Then, the PPV precursor is heated for about 8 hours in a vacuum atmosphere kept at a temperature of about 320° C. This results in the organic layer 6 being formed of PPV into a single-layer structure between each adjacent two of the ribs 8.

After the organic layers 6 are thus formed, the upper electrodes 7 each are formed in the form of a film on each of the organic layers 6. Two processes may be employed for formation of the upper electrodes 7.

One of the processes is a mask-less process which takes place without using a mask and in such a manner as shown in FIGS. 6(*a*)–6(*d*). More particularly, a conductive material 12 for the upper electrodes 7 is deposited on the transparent electrodes 4 on which the organic layers 6 and ribs 8 are formed, as indicated in FIG. 6(*a*). The material 12 may be selected from the group consisting of, for example, Mg:Ag alloy, Mg:In alloy, Li:Al alloy, In, Al and the like.

Then, a portion of the material 12 formed on the ribs 8 is removed by scraping, rubbing or the like, leading to patterning (FIG. 6(*b*)). This results in the upper electrodes 7 each being deposited in the form of a film all over the organic layer 6.

Figure 6A:
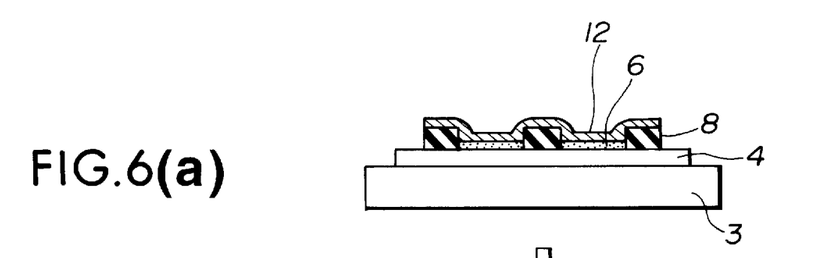
FIGS. 6(a)–6(d) illustrate a flow chart showing a group of steps in an example of formation of upper electrodes incorporated in an organic electroluminescent display device of the present invention.
Figure 6B:
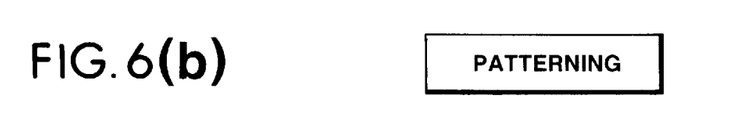
Figure 6C:
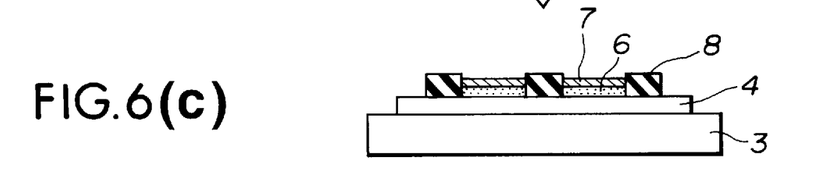
Figure 6D:
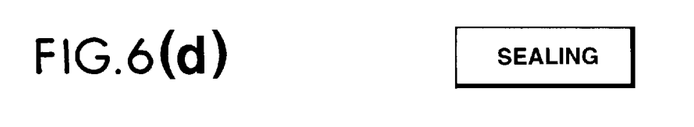

Thereafter, the upper substrate 1 is sealedly joined to the lower transparent substrate 3, so that the organic EL display device may be completed.

The other process is mask deposition techniques, which are practiced in such a manner as shown (FIGS. 7(*a*)–7(*d*). More particularly, in the mask deposition techniques wherein a mask 13 formed with slits 14 corresponding to the ribs 8 is prepared by deposition as indicated at in FIG. 7(*a*) and then mounted on the transparent electrodes 4 on which the organic layers 6 and ribs 8 are formed, as indicated at in FIG. 7(*b*). Then, a material for the upper electrodes 7 is deposited on the mask 13, so that the upper electrodes 7 may be formed on the organic layers 6 between the ribs 8 through the slits 14 of the mask 13. Subsequently, the mask 13 is removed, resulting in the upper electrodes 7 each being formed as a film on only the organic layer 6 as indicated at in FIG. 7(*c*) while being kept from being formed on each of the ribs 8.

Figure 7A:
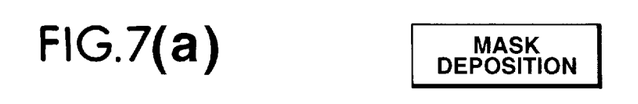
FIGS. 7(a)–7(d) illustrate a flow chart showing a group of steps in another example of formation of upper electrodes incorporated in an organic electroluminescent display device of the present invention.
Figure 7B:
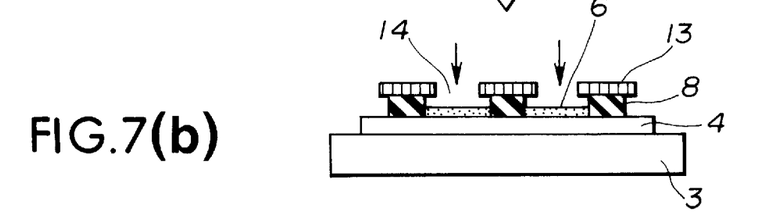
Figure 7C:
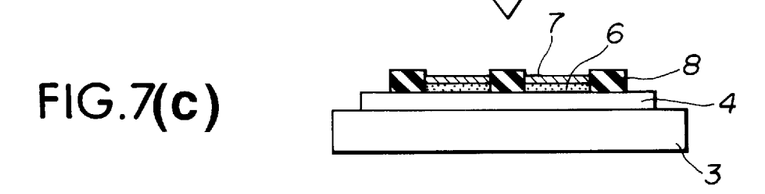
Figure 7D:
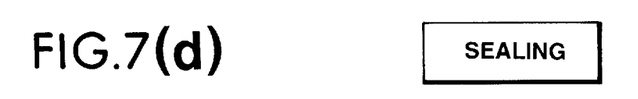

Thereafter, the upper substrate 1 is sealedly joined to the lower transparent substrate 3, to thereby provide the organic EL display device.

Then, a cap layer made of aluminum or the like is formed on each of the upper electrodes 7 by deposition as required. When the cap layer is made of metal, a portion of the cap layer deposited on the ribs 8 is mechanically removed therefrom as in formation of the upper electrodes 7.

The sealed joining may be carried out by vacuum sealing, gas sealing, liquid sealing or solid sealing. During sealing operation, the ribs 8 each also function as a spacer contacted with the upper substrate 1 to support both upper and lower substrates 1 and 3 while being interposed therebetween. The vacuum sealing takes place while applying a getter on an inner surface of the upper substrate. The gas sealing takes place using He, Ar, N or the like and the liquid sealing takes place using liquid such as liquid paraffin, silicone liquid or the like. Solid such as fluororesin or the like is used for the solid sealing.

The present invention constructed as described above permits the upper electrodes to be formed while preventing any gap from being formed between the ribs and the upper electrodes, so that the EL element may be prepared in a vacuum atmosphere while keeping the organic layers from being exposed, resulting in entrance of oxygen, moisture or the like into the interface. Thus, the present invention permits durability of the organic electroluminescent display device to be significantly improved.

Also, the present invention permits each of the ribs to function as a spacer as well.

Further, a portion of the conductive film formed on each of the ribs is mechanically removed, so that the cap layer provided in the form of a film on each of the upper electrodes may be made of metal exhibiting satisfactory characteristics.

While a preferred embodiment of the invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. An organic electroluminescent display device comprising:

a light-permeable substrate;

a plurality of transparent electrodes arranged in a stripe-like manner on said light-permeable substrate and formed of a light-permeable conductive film;

a plurality of ribs made of an insulating material and arranged in a stripe-like manner on said transparent electrodes so as to extend in a direction perpendicular to said transparent electrodes;

organic layers each formed of an organic electroluminescent medium and arranged between each adjacent two of said ribs; and upper electrodes each made of a conductive film deposited all over each of said organic layers and formed into a thickness which does not exceed a thickness of each of said ribs.

2. An organic electroluminescent display device as defined in claim 1, further comprising a seal member arranged in a frame-like manner on an outer periphery of said light-permeable substrate and formed into a thickness substantially identical with that of said rib; and an upper substrate fixedly arranged on said seal member.

3. A method for manufacturing an organic electroluminescent display device, the method comprising the steps of:

arranging a plurality of transparent electrodes in a stripe-like manner on a light-permeable substrate;

said transparent electrodes being made of a light-permeable conductive film;

forming a plurality of insulating ribs in a stripe-like manner on said transparent electrodes so as to extend in a direction perpendicular to said transparent electrodes;

arranging organic layers in the form of a film between each adjacent two of said ribs;

said organic layers each being made of an organic electroluminescent medium; and forming a conductive film all over each of said organic layers by deposition so as to have a thickness which does not exceed a thickness of said ribs;

a portion of said conductive film deposited on each of said ribs being mechanically removed, resulting in an upper electrode being formed on each of said organic layers.

4. A method for manufacturing an organic electroluminescent display device, the method comprising the steps of:

arranging a plurality of transparent electrodes in a stripe-like manner on a light-permeable substrate;

said transparent electrodes being made of a light-permeable conductive film;

forming a plurality of insulating ribs in a stripe-like manner on said transparent electrodes so as to extend in a direction perpendicular to said transparent electrodes;

arranging organic layers in the form of a film between each adjacent two of said ribs;

said organic layers each being made of an organic electroluminescent medium;

arranging, on said ribs, a mask formed with slits; and depositing a conductive film on only each of said organic layers through each of said slits to form an upper electrode on each of said organic layers.

5. An organic electroluminescent display device as defined in claim 1, wherein said plurality of ribs are arranged in laterally spaced rows so as to be parallel to each other.

6. A method according to claim 3, wherein said step of forming said plurality of ribs on said transparent electrodes comprises arranging said plurality of ribs in laterally spaced rows so as to be parallel to each other.

7. A method according to claim 4, wherein said step of forming said plurality of ribs on said transparent electrodes comprises arranging said plurality of ribs in laterally spaced rows so as to be parallel to each other.

* * * * *

UNITED STATES PATENT AND TRADEMARK OFFICE
CERTIFICATE OF CORRECTION

PATENT NO. : 5,804,917
DATED : September 8, 1998
INVENTOR(S) : Hisamitsu TAKAHASHI, et al.

It is certified that error appears in the above-identified patent and that said Letters Patent is hereby corrected as shown below:

On the title page, Item [30], the Foreign Application Priority Data, is missing. It should be:

--Jan.31, 1995    [JP]   Japan............07-032941--

Signed and Sealed this

Eleventh Day of May, 1999

*Attest:*

Q. TODD DICKINSON

*Attesting Officer*          Acting Commissioner of Patents and Trademarks